United States Patent
Kim et al.

(10) Patent No.: US 7,129,867 B2
(45) Date of Patent: Oct. 31, 2006

(54) APPARATUS AND METHOD FOR CORRECTING DC OFFSET OF RECEIVER IN MULTIBAND-HOPPING COMMUNICATION SYSTEM

(75) Inventors: Wan-jin Kim, Seoul (KR); Jae-hyun Koo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/172,856

(22) Filed: Jul. 5, 2005

(65) Prior Publication Data

US 2006/0001558 A1 Jan. 5, 2006

(30) Foreign Application Priority Data

Jul. 2, 2004 (KR) .................. 10-2004-0051386

(51) Int. Cl.
*H03M 1/06* (2006.01)
(52) U.S. Cl. .................. 341/118; 341/119; 341/120
(58) Field of Classification Search .......... 341/118, 341/144, 143, 120, 119; 358/446; 327/307; 375/319; 345/98; 360/46
See application file for complete search history.

(56) References Cited

U.S. PATENT DOCUMENTS

| 4,473,901 | A | * | 9/1984 | Jensen | 370/520 |
| 5,583,706 | A | * | 12/1996 | Dudley et al. | 360/46 |
| 6,038,038 | A | * | 3/2000 | Selby et al. | 358/446 |
| 6,054,887 | A | * | 4/2000 | Horie et al. | 327/307 |
| 6,344,814 | B1 | * | 2/2002 | Lin et al. | 341/144 |
| 6,356,217 | B1 | * | 3/2002 | Tilley et al. | 341/118 |
| 6,625,232 | B1 | * | 9/2003 | Tilley | 375/319 |
| 6,646,581 | B1 | * | 11/2003 | Huang | 341/143 |
| 6,750,839 | B1 | * | 6/2004 | Hogan | 345/98 |
| 6,963,297 | B1 | * | 11/2005 | Robinson et al. | 341/143 |

* cited by examiner

*Primary Examiner*—Jean Bruner Jeanglaude
(74) *Attorney, Agent, or Firm*—Sughrue Mion, PLLC

(57) ABSTRACT

A DC offset correction apparatus and method of a receiver in a multiband-hopping communication system is provided. The DC offset correction apparatus of the receiver in the communication system which hops to a plurality of bands, includes a controller for generating and outputting a plurality of DC offset correction signals different from each other for the respective bands; a plurality of digital-to-analog converters (DACs) for receiving, digital-to-analog converting and outputting the plurality of the DC offset correction signals from the controller; an analog multiplexer (MUX) for switching to output one of the plurality of the DC offset correction signals output from the plurality of the DACs, respectively; and an adder for adding and outputting an input signal with the output signal of the analog MUX. Accordingly, the DC offset correction apparatus can be implemented by low-speed DACs and the fast analog MUX that are relatively small-sized and low-cost elements.

13 Claims, 6 Drawing Sheets

APPARATUS AND METHOD FOR CORRECTING DC OFFSET OF RECEIVER IN MULTIBAND-HOPPING COMMUNICATION SYSTEM

CROSS-REFERENCE TO RELATED APPLICATIONS

This application claims priority from Korean Patent Application No. 2004-51386 filed on Jul. 2, 2004 in the Korean Intellectual Property Office, the entire disclosure of which is incorporated herein by reference.

BACKGROUND OF THE INVENTION

1. Field of the Invention

Apparatuses and methods consistent with the present invention generally relates to a direct current (DC) offset correction apparatus and method. More specifically, the present invention relates to an apparatus and method for correcting a DC offset at a receiver used in a communication system which fast hops to an ultra wide multiband.

2. Description of the Related Art

FIG. 1A is a block diagram of a conventional receiver. A local oscillator (LO) signal generated by an LO (not shown) is reflected at an antenna (not shown) or a low noise amplifier (LNA) 11, the reflected LO signal is mixed with an LO signal generated by the LO at a mixer 13, and thus a direct current (DC) offset signal is introduced. In addition, the DC offset signal may be introduced from a received radio frequency (RF) signal, in which a level of the DC offset signal is insignificant.

The DC offset signal is not removed at a low pass filter 15. Thus, the DC offset signal distorts information signals around the DC, saturates and disables an intermediate frequency amplifier (17) or an analog-to-digital converter (ADC) 19 from normal operations. Removal of the DC offset signal is required, especially the DC offset signal made at the LO signal having a relatively high signal level, so as to enhance performance of a receiver.

The following explains a conventional method to remove a DC offset signal.

FIG. 1B is a receiver using an alternating current (AC) coupling capacitor to remove a DC offset signal. The receiver of FIG. 1B includes the AC coupling capacitor 14 as compared with that of FIG. 1A. The receiver of FIG. 1B removes a DC offset signal output from a mixer 13 at the AC coupling capacitor 14 which functions as a high pass filter (HPF).

As above, the AC coupling capacitor 14 enables the removal of the DC offset signal with the most convenient and effective method. However, the AC coupling capacitor 14 attenuates information signals around DC as well as the DC offset signal, as shown in a frequency spectrum of FIG. 1C. Referring to FIG. 1C, as the DC offset signal is removed by the AC coupling capacitor 14, signals containing information also are attenuated around DC. As a result, the received information may be distorted.

Furthermore, the above DC offset compensation method using the AC coupling capacitor 14 is not suitable for a communication system which fast hops to a multiband. Since the multiband-hopping communication system uses different bands per a time interval, the receiver has to generate different LO signals for each band. In other words, the receiver needs to generate different LO signals for each time, which results in DC offset signals having different levels.

FIG. 1D depicts a level of DC offset signals caused at a receiver of a communication system that hops to three bands. In FIG. 1D, a DC offset signal with a level $V_1$ is generated in a time interval $t_1$ in which communications are performed across a first band, a DC offset signal with a level $V_2$ is generated in a time interval $t_2$ in which communications are performed across a second band, and a DC offset signal with a level $V_3$ is generated in a time interval $t_3$ in which communications are performed across a third band.

It takes a certain time to remove the DC offset signal at the AC coupling capacitor 14, and the certain time corresponds to a transient time of the AC coupling capacitor 14. In the case of high-speed band-hopping, another DC offset signal with a different level is input to the AC coupling capacitor 14 before the transient time of the AC coupling capacitor 14, that is, before the DC offset is completely removed. Thus, a stepped waveform is produced at each band transition time as shown in FIG. 1E. The stepped waveforms affect all bands as with a white noise and considerably deteriorates a signal to noise ratio (SNR) of the receiver.

FIGS. 2 and 3 are DC offset correction circuits that do not use an AC coupling capacitor. In detail, FIG. 2 is a DC offset correction device using a feed-forward manner, and FIG. 3 is a DC offset correction device using a feed-back manner.

In the DC offset correction device of FIG. 2, an analog signal output from a mixer 21 is converted to a digital signal by an ADC 23 and output to a DSP 25. The DSP 25 detects a level of the DC offset signal from the output signal, and generates a correction signal for the sake of the DC offset correction. The generated DC offset correction signal is converted to an analog signal at a digital-to-analog converter (DAC) 27, and the converted DC offset correction signal is added to an original signal at an adder 29. Thus, the DC offset signal can be eliminated.

In the DC offset correction device of FIG. 3, an analog signal is amplified at an amplifier 33, converted to a digital signal at an ADC 35, and input to a controller 37. The controller 37 detects a DC offset signal from the input signal, generates and outputs a DC offset correction signal to a DAC 39. The DC offset correction signal is converted to an analog signal at the DAC 39, and added to an original signal at an adder 31. As a result, the DC offset is eliminated.

As mentioned above, since a DC offset signal with a different level is generated at each time interval in the case of a multiband-hopping communication system, a DC offset correction signal different at each time interval needs to be applied to the adder 29 or 31. However, a Multi Band-Orthogonal Frequency Division Multiplexing (MB-OFDM), which is an example of the multiband-hopping system, has a band transition time of substantially 9 ns, and requires a high-speed DAC to support such a band transition time. However, it is disadvantageous to use a high-speed DAC in that the high-speed DAC is hard to implement. Moreover, even if it is possible to implement such a high-speed DAC, the high-speed DAC has a larger size than a low-speed DAC and requires a high manufacturing cost.

SUMMARY OF THE INVENTION

An aspect of the present invention provides a direct current (DC) offset correction apparatus and method of a multiband-hopping communication system by implementing the DC offset correction apparatus with relatively low-cost and small-sized elements.

To achieve the above and other aspects of the present invention, a DC offset correction apparatus of a receiver in a communication system which hops to a plurality of bands, comprises a controller for generating and outputting a plurality of DC offset correction signals different from each other for the respective bands; a plurality of DACs for receiving, digital-to-analog converting and outputting the plurality of the DC offset correction signals from the controller; an analog multiplexer (MUX) for switching to output one of the plurality of the DC offset correction signals output from the plurality of the DACs, respectively; and an adder for adding and outputting an input signal with the output signal of the analog MUX.

The plurality of the DACs can be implemented by low-speed DACs. The switch operation of the analog MUX is carried out within a band transition time required to hop to the plurality of the bands. The analog MUX switches in reference to an input band hopping sequence.

The DC offset correction apparatus further comprises an amplifier for amplifying and outputting the output signal of the adder with a certain gain; and an ADC for analog-to-digital converting and outputting the output signal of the amplifier to the controller.

The controller detects a DC offset signal from the output signal of the ADC, and generates the DC offset correction signals based on the detected DC offset signal.

The controller adjusts the certain gain of the amplifier so that the ADC can process the output signal of the amplifier.

The output signal of the ADC can be output to a demodulator which demodulates a received signal.

Consistent with the above aspect of the present invention, a DC offset correction method of a receiver in a communication system which hops to a plurality of bands, comprises the operations of a) generating a plurality of DC offset correction signals different for the plurality of the bands; b) digital-to-analog converting the plurality of the DC offset correction signals being generated, respectively; c) outputting selectively one of the plurality of the DC offset correction signals being converted; and d) adding an input signal with the selectively output DC offset correction signal.

The operation c) is carried out within a band transition time required to hop to the plurality of the bands.

Further, the operation c) selects one of the plurality of the DC offset correction signals being converted in reference to a band hopping sequence.

The DC offset correction method further comprises the operations of e) amplifying the signal added at operation d) with a certain gain; and f) analog-to-digital converting the signal amplified at operation e).

The operation a) detects a DC offset signal from the signal converted at operation f), and generates the DC offset correction signals based on the detected DC offset signal.

BRIEF DESCRIPTION OF THE DRAWING FIGURES

These and/or other aspects of the invention will become apparent and more readily appreciated from the following description of exemplary embodiments, taken in conjunction with the accompanying drawing figures of which:

DETAILED DESCRIPTION OF THE EXEMPLARY EMBODIMENTS

Figure 1A:
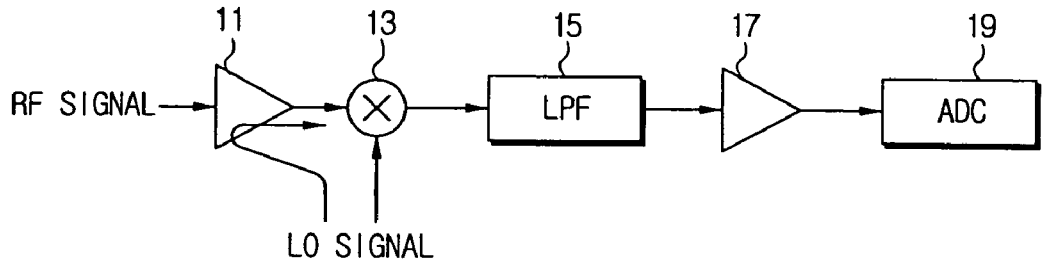
FIGS. 1A to 1E illustrates that a receiver corrects a DC offset using a AC coupling capacitor according to conventional methods.
Figure 1B:
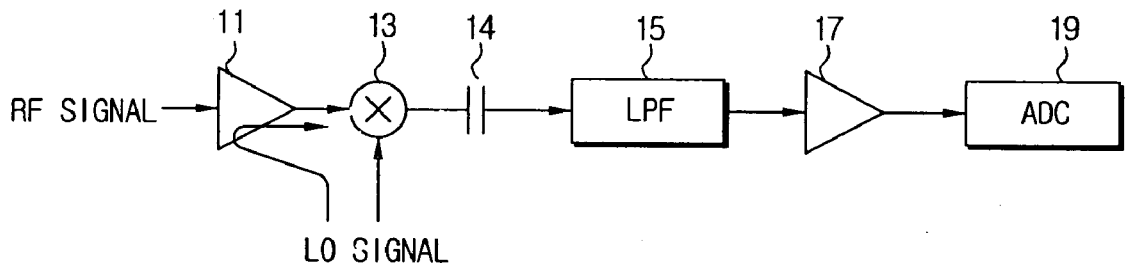
Figure 1C:
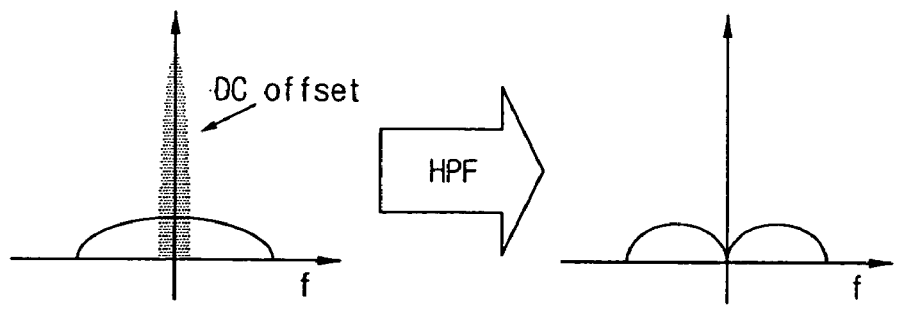
Figure 1D:
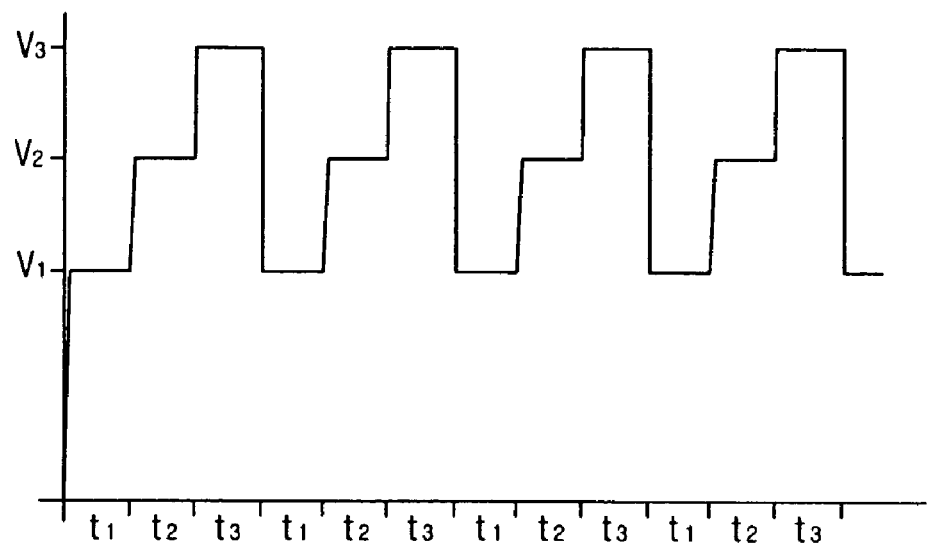
Figure 1E:
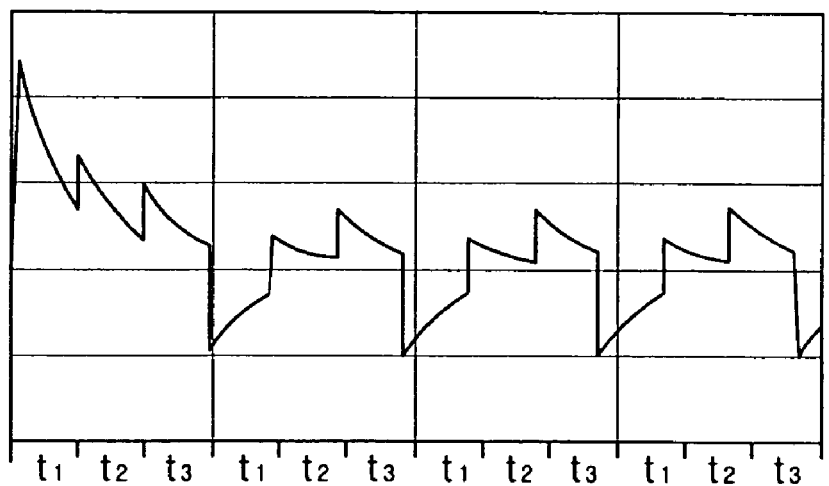
Figure 2:
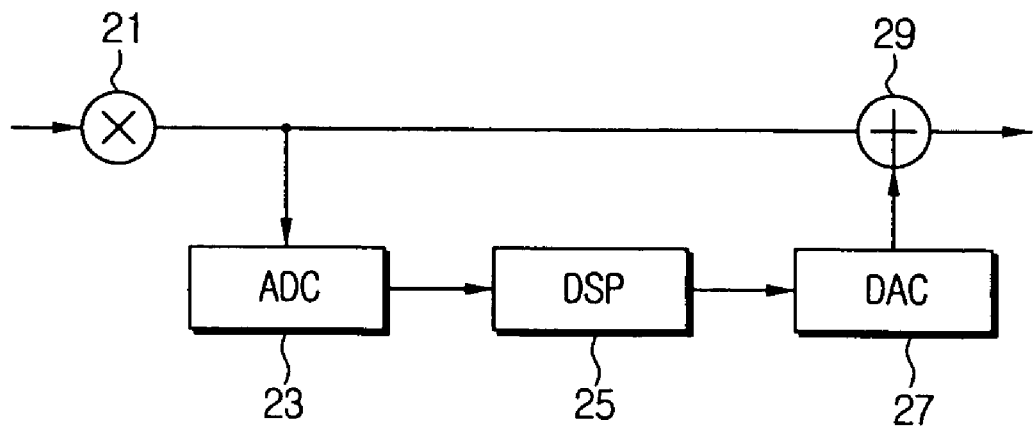
FIG. 2 is a block diagram of a DC offset correction device using a feed-forward manner.
Figure 3:
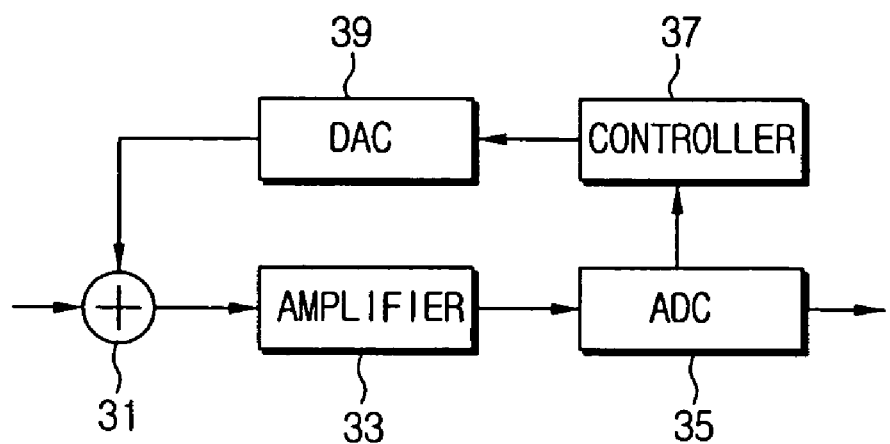
FIG. 3 is a block diagram of a DC offset correction device using a feed-back manner.

Reference will now be made in detail to the exemplary embodiments of the present invention, examples of which are illustrated in the accompanying drawings, wherein like reference numerals refer to the like elements throughout. Exemplary embodiments are described below in order to explain the present invention by referring to the drawings.

Figure 4:
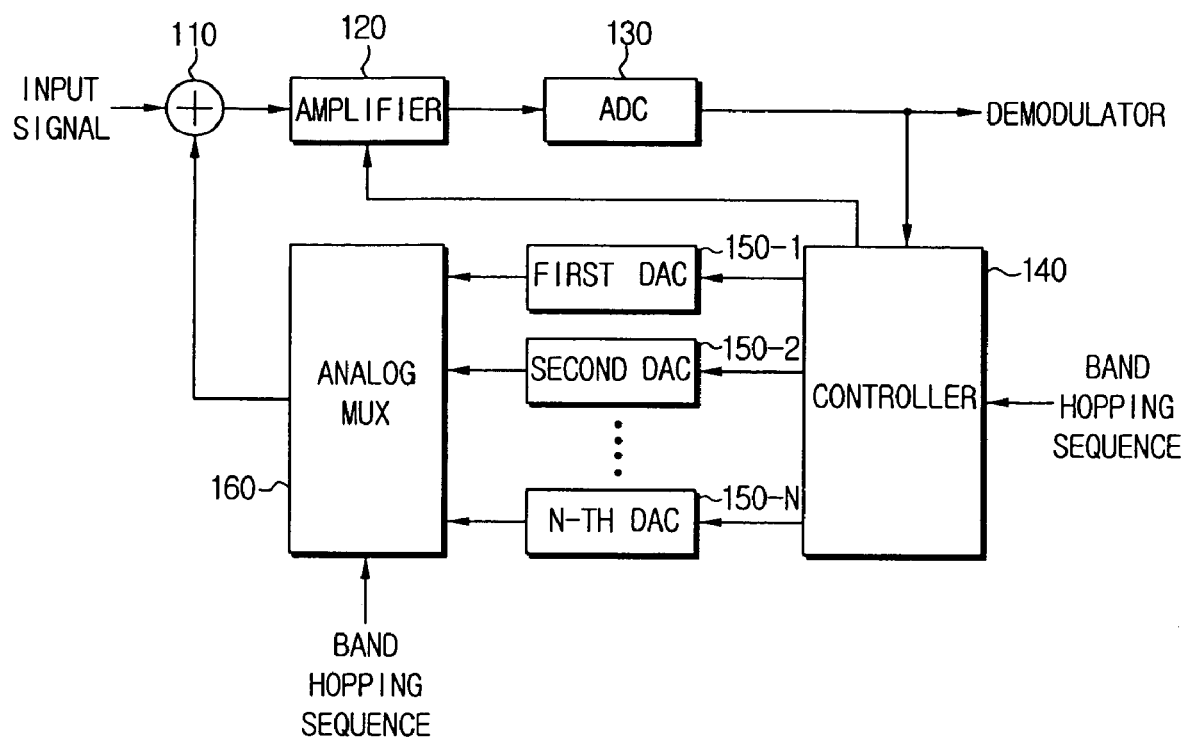
FIG. 4 is a block diagram of a DC offset correction apparatus of a receiver in a multiband-hopping communication system according to an embodiment of the present invention.

FIG. 4 is a block diagram of a DC offset correction apparatus of a receiver in a multiband-hopping communication system according to an exemplary embodiment of the present invention. Referring to FIG. 4, the DC offset correction apparatus includes an adder 110, an amplifier 120 an ADC 130, a controller 140, first to N-th DAC 150-1 to 150-N, and a MUX 160.

The amplifier 120 amplifies and outputs an output signal from the adder 110 with a certain gain G. The certain gain G is specified by the controller 140.

An input signal of the amplifier 120 contains a DC offset signal. As explained in reference to the related art, the DC offset signal is introduced from an LO signal, and the LO signal varies depending on a current hopped band. Accordingly, a level of the DC offset signal also varies depending on the current hopped band. To be specific, in a case where a communication system hops to N-ary bands, a first DC offset signal generated when a current hopped band is a first band, a second DC offset signal generated when the current hopped band is a second band . . . , and a N-th DC offset signal generated when the current hopped band is a N-th band, respectively, have different levels from each other.

The ADC 130 converts the amplified analog signal output from the amplifier 120 to a digital signal. The output signal from the ADC 130 is supplied to a demodulator and the controller 140.

Figure 6:
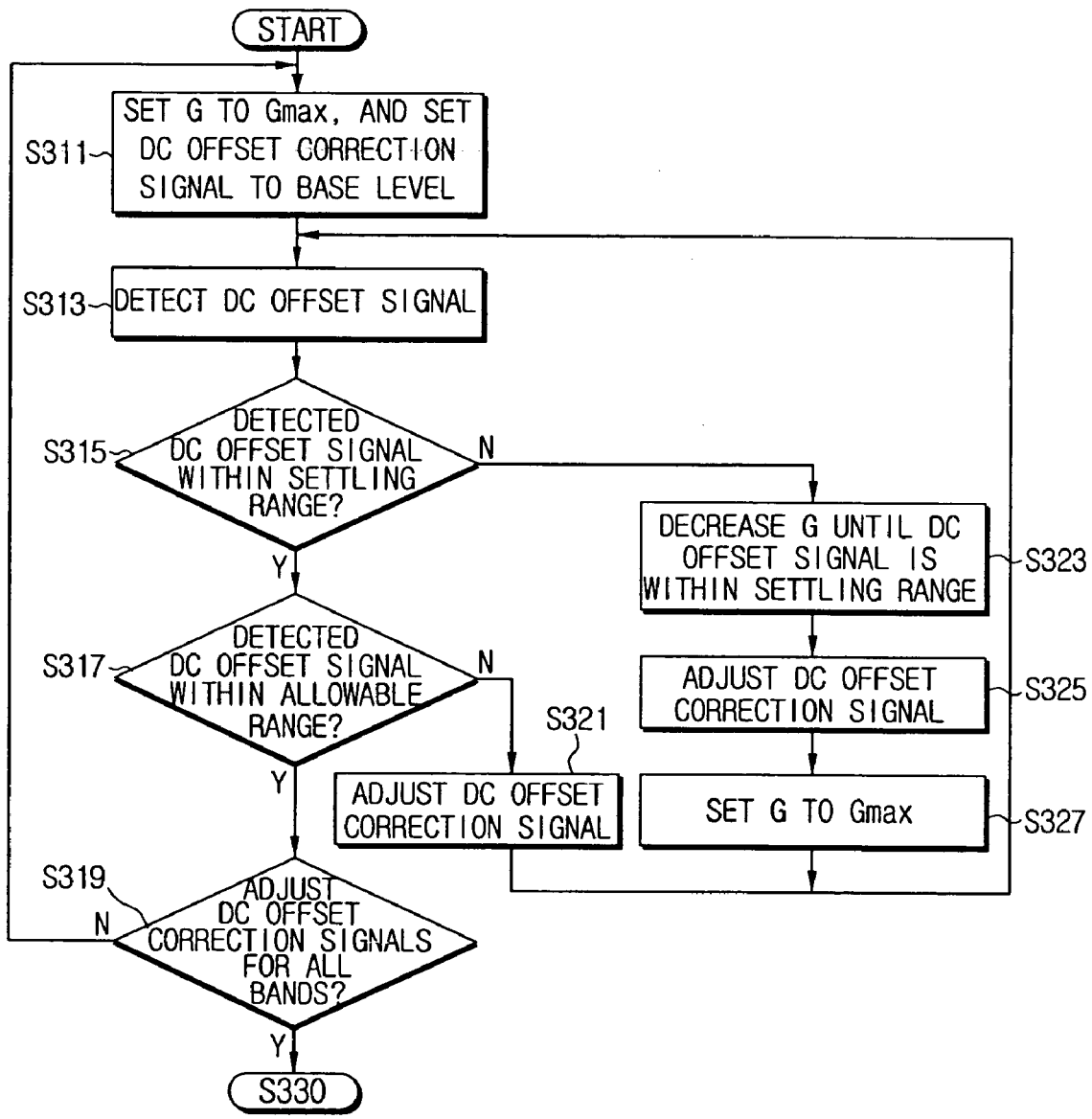
FIG. 6 is a flowchart of a DC offset correction signal adjusting operation of FIG. 5.

In a calibration interval, the controller 140 adjusts DC offset signals by use of a DC offset correction algorithm. The DC offset correction algorithm as shown in FIG. 6 will be explained below. After the calibration interval, the controller 140 generates and outputs the adjusted DC offset correction signals.

The controller 140 generates DC offset correction signals different for each band since the level of the DC offset signal varies for each band. An exemplary embodiment of the present invention adopts a communication system which hops to N-ary bands. Hence, the controller 140 generates N-ary DC offset correction signals (first to N-th DC offset correction signals) for N-ary bands, respectively.

The controller 140 outputs the first to N-th DC offset correction signals to the first to N-th DAC 150-1 to 150-N, respectively. Specifically, the controller 140 outputs the first DC offset correction signal to the first DAC 150-1, the second DC offset correction signal to the second DAC 150-2, . . . , and the N-th DC offset correction signal to the N-th DAC 150-N.

The first to N-th DACs 150-1 to 150-N respectively convert the first to N-th DC offset correction signals from digital signals to analog signals, and output the analog signals to the analog MUX 160. It is possible to implement the first to N-th DACs 150-1 to 150-N by low-speed DACs.

The analog MUX 160 switches to output to the adder 110 one of the first to N-th DC offset correction signals input from the first to N-th DACs 150-1 to 150-N.

It may be preferable to implement the analog MUX 160 as an analog MUX capable of fast switching, so as to prevent a high-speed band hopping in the multiband-hopping communication system. For example, a Multi Band-Orthogonal Frequency Division Multiplexing (MB-OFDM) being the multiband-hopping communication system has a band transition time of substantially 9 ns. The band transition time is a time required for the band hopping. If the present invention is applied to the MB-OFDM, the analog MUX 160 has to switch within substantially 9 ns.

The analog MUX 160 utilizes an input band hopping sequence during the switching operation in order to output the DC offset correction signal corresponding to the current hopped band to the adder 110. In further detail, if the current hopped band is the first band, the analog MUX 160 switches to output the first DC offset correction signal from the first DAC 150-1 to the adder 110, if the current hopped band is the second band, the analog MUX 160 switches to output the second DC offset correction signal from the second DAC 150-2 to the adder 110, . . . , and if the current hopped band is the N-th band, the analog MUX 160 switches to output the N-th DC offset correction signal from the N-th DAC 150-N to the adder 110.

The adder 110 adds the input signal with the DC offset correction signal output from the analog MUX 160, in which the DC offset signal in the input signal attenuates.

Figure 5:
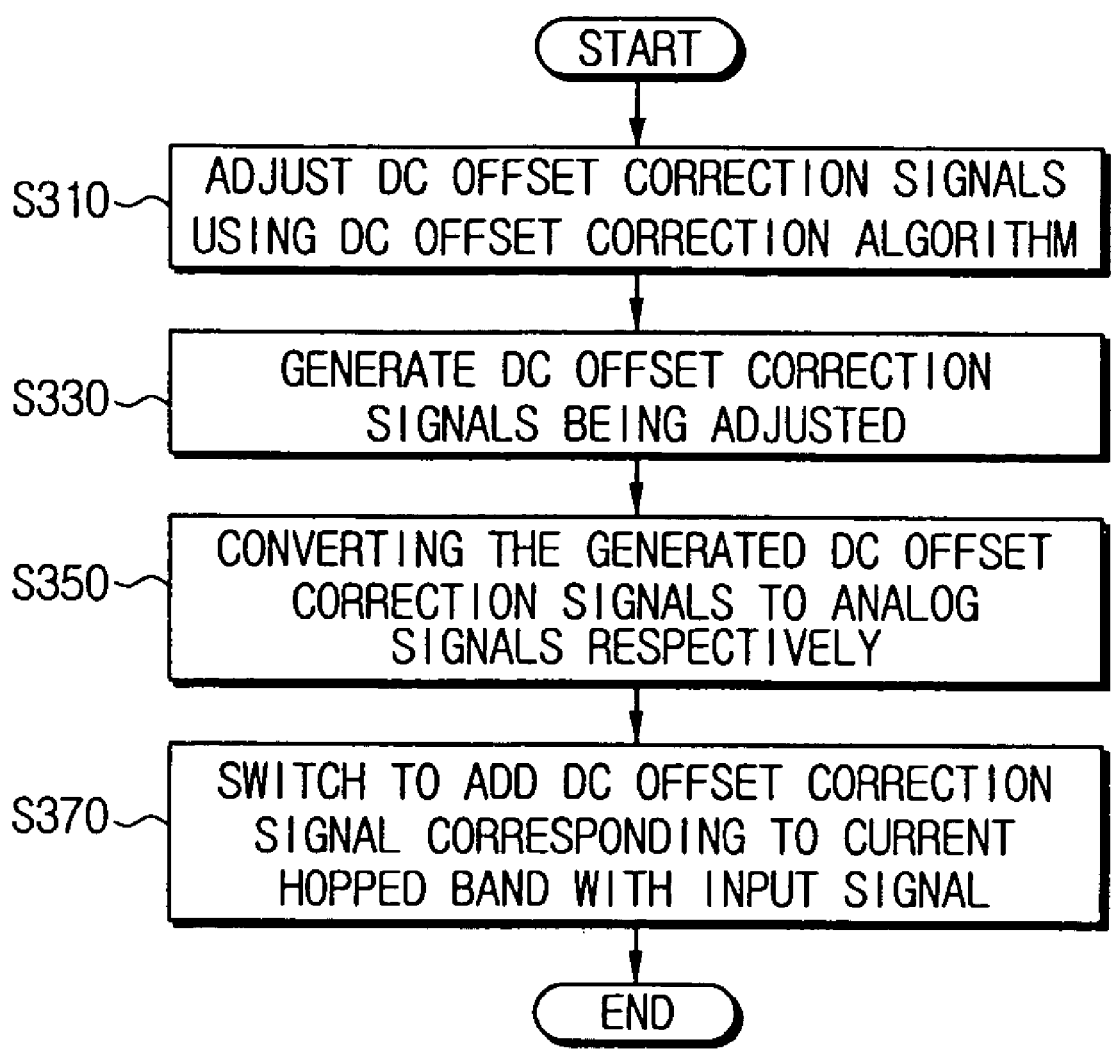
FIG. 5 is a flowchart of a DC offset correction method of the receiver in the multiband-hopping communication system of FIG. 4.

The following explains that the DC offset correction apparatus of FIG. 4 adjusts the DC offset correction signal and corrects the DC offset by means of the adjusted DC offset correction signal in reference to FIGS. 5 and 6.

FIG. 5 is a flowchart of a DC offset correction method of the receiver in the multiband-hopping communication system of FIG. 4, and FIG. 6 is a flowchart of the DC offset correction signal adjusting operation of FIG. 5.

Referring to FIG. 5, the controller 140 adjusts the DC offset correction signals by means of the DC offset correction algorithm (S310).

The adjustment the DC offset correction signals at operation 310 is described in further detail in relation with FIG. 6.

Referring now to FIG. 6, the controller 140 sets a gain G of the amplifier 120 as a maximum gain Gmax, and sets the DC offset correction signal as a base level (S311). The input signal is added with the DC offset correction signal of the base level at the adder 110. The added signal is amplified to the maximum gain Gmax at the amplifier 120, converted to a digital signal at the ADC 130, and input to the controller 140. The controller 140 detects the DC offset signal from the input signal (S313).

The controller 140 determines whether the detected DC offset signal is within a settling range (S315) and whether the detected DC offset signal is within an allowable range (S317). The settling range indicates a level range of the DC offset signal that can be settled. That is, the ADC 130 and the controller 140 cannot normally settle the DC offset signal having too high level, in which the DC offset signal is out of the settling range. The allowable range indicates a level range of the DC offset signal that conforms to a specification or does not affect the reception performance of the receiver. If the DC offset signal is out of the allowable range, it is regarded that the DC offset signal does not conform to the specification or the reception performance of the receiver deteriorates.

If it is determined that the detected DC offset signal is out of the settling range (S315), the controller 140 resets the gain G of the amplifier 120 to smaller than the maximum gain Gmax until the detected DC offset signal falls within the settling range (S323). When the DC offset signal is within the settling range, the controller 140 adjusts the DC offset correction signal based on the level of the detected DC offset signal (S325).

The adjusted DC offset correction signal at the controller 140 is input to the adder 110 via one of the first to N-th DACs 150-1 to 150-N and the analog MUX 160. The output operation of the controller 140 and the switch operation of the analog MUX 160 are carried out in reference to the band hopping sequence.

The controller 140 resets the gain G of the amplifier 120 to the maximum gain Gmax (S327).

The input signal is added with the DC offset correction signal adjusted at operation S325 at the adder 110. The added signal is amplified to the maximum gain Gmax at the amplifier 120, converted to a digital signal at the ADC 130, and input to the controller 140. During these operations, the controller 140 proceeds to operation S313.

When it is determined that the detected DC offset signal at operation S313 is within the settling range (S315) but out of the allowable range (S317), the controller 140 adjusts the DC offset correction signal based on the level of the detected DC offset signal (S321).

The adjusted DC offset correction signal at the controller 140 is input to the adder 110 via one of the first to N-th DACs 150-1 to 150-N and the analog MUX 160. The output operation of the controller 140 and the switch operation of the analog MUX 160 are carried out in reference to the band hopping sequence.

Next, the input signal is added with the adjusted DC offset correction signal at operation S321 at the adder 110. The added signal is amplified to the maximum gain Gmax at the amplifier 120, converted to a digital signal at the ADC 130, and input to the controller 140. During these operations, the controller 140 proceeds to operation S315.

When it is determined that the detected DC offset signal at operation S313 is within the settling range (S315) and within the allowable range (S317), the controller 140 does not adjust the DC offset correction signal.

The adjustment of the DC offset correction signal is carried out for each band, and thus repeated until the DC offset correction signals are adjusted with respect to all the bands, that is, the N-ary bands (S319). Thus, the first DC offset correction signal for the first band, the second DC offset correction signal for the second band, . . . , the N-th DC offset correction signal for the N-th band are all adjusted.

Referring back to FIG. 5, after all the DC offset correction signals are adjusted (S310), the controller 140 generates first to N-th DC offset correction signals being adjusted (S330).

The first to N-th DC offset correction signals are input to the first to N-th DACs 150-1 to 150-N and converted to an analog signal, respectively (S350).

The analog MUX 160 switches to add the DC offset correction signal corresponding to the current hopped band with the input signal at the adder 110 (S370). Specifically, the analog MUX 160 switches to output one of the first to N-th DC offset correction signals, which are input from the first to N-th DACs 150-1 to 150-N, to the adder 110 in reference to the input band hopping sequence.

More precisely, the analog MUX 160 switches to output to the adder 110 the first DC offset correction signal being input from the first DAC 150-1 as for the first band, the second DC offset correction signal being input from the second DAC 150-2 as for the second band, . . . , the N-th DC offset correction signal being input from the N-th DAC 150-N as for the N-th band.

In the above exemplary embodiment of the present invention, the DC offset is corrected in the multiband-hopping communication system by use of the plurality of the low-speed DACs and the high-speed analog MUX, instead of one high-speed DAC. The low-speed DAC is small-sized and low-cost. The high-speed DAC of 80 Msps is larger than the low-speed DAC of 1 Msps by substantially 80 times. Accordingly, even when the plurality of the low-speed DACs are employed as above, it is advantageous with respect to the volume of the receiver as compared with a single high-speed DAC. Furthermore, the high-speed analog MUX is small-sized and low-cost as well, which does not greatly affect the volume and the unit cost of the receiver.

It is explained that the algorithm of FIG. 6 is the DC offset correction algorithm by way of example, for the sake of understanding. The DC offset correction algorithm can employ any algorithms capable of adjusting the DC offset correction signal by bands.

In light of the forgoing as above, the DC offset correction apparatus of the receiver in the multiband-hopping communication system can be realized with the low-speed DAC and the high-speed analog MUX which are small-sized and low-cost. Therefore, the volume of the receiver is reduced and the manufacturing cost lowers.

While exemplary embodiments of the present invention have been described, additional variations and modifications of the embodiments may occur to those skilled in the art once they learn of the basic inventive concepts. Therefore, it is intended that the appended claims shall be construed to include both the above embodiments and all such variations and modifications that fall within the spirit and scope of the invention.

What is claimed is:

1. A direct current (DC) offset correction apparatus of a receiver in a communication system which hops to a plurality of bands, comprising:
   a controller, which generates and outputs a plurality of DC offset correction signals different from each other for the plurality of bands;
   a plurality of digital-to-analog converters (DACs) which receives the plurality of the DC offset correction signals from the controller, and digital-to-analog converts and outputs the plurality of DC offset correction signals;
   an analog multiplexer (MUX) which selectively outputs one of the plurality of the DC offset correction signals output from the plurality of the DACs, respectively; and
   an adder which adds and outputs an input signal with the DC offset correction signal of the analog MUX.

2. The DC offset correction apparatus according to claim 1, wherein the DACs are implemented by low-speed DACs.

3. The DC offset correction apparatus according to claim 1, wherein the switching of the analog MUX is carried out within a band transition time required to hop to the plurality of the bands.

4. The DC offset correction apparatus according to claim 3, wherein the analog MUX switches in reference to an input band hopping sequence.

5. The DC offset correction apparatus according to claim 1, further comprising:
   an amplifier which amplifies an output signal of the adder with a gain; and
   an analog-to-digital converter (ADC) which analog-to-digital converts an output signal of the amplifier which is output to the controller.

6. The DC offset correction apparatus according to claim 5, wherein the controller detects a DC offset signal from an output signal of the ADC, and generates the plurality of DC offset correction signals based on the detected DC offset signal.

7. The DC offset correction apparatus according to claim 6, wherein the controller adjusts the gain of the amplifier so that the ADC can process the output signal of the amplifier.

8. The DC offset correction apparatus according to claim 5, wherein the output signal of the ADC can be output to a demodulator which demodulates a received signal.

9. A direct current (DC) offset correction method of a receiver in a communication system which hops to a plurality of bands, the method comprising:
   a) generating a plurality of DC offset correction signals different from each other for the plurality of bands;
   b) digital-to-analog converting the plurality of the DC offset correction signals, respectively;
   c) outputting selectively one of the plurality of the DC offset correction signals which has been converted; and
   d) adding an input signal with the DC offset correction signal which has been selectively output.

10. The DC offset correction method according to claim 9, wherein c) is carried out within a band transition time required to hop to the plurality of the bands.

11. The DC offset correction method according to claim 10, wherein c) comprises selecting one of the plurality of the DC offset correction signals being converted in reference to a band hopping sequence.

12. The DC offset correction method according to claim 9, further comprising:
   e) amplifying a signal resulting from the adding in d) with a certain gain; and
   f) analog-to-digital converting a signal resulting from the amplifying in e).

13. The DC offset correction method according to claim 12, wherein a) comprises detecting a DC offset signal from a signal resulting from the analog-to-digital converting in f), and generating the DC offset correction signals based on the DC offset signal which has been detected.

* * * * *